US011502205B2

(12) United States Patent
Hori et al.

(10) Patent No.: US 11,502,205 B2
(45) Date of Patent: Nov. 15, 2022

(54) SEMICONDUCTOR DEVICE HAVING SCHOTTKY BARRIER DIODE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yoichi Hori, Himeji Hyogo (JP); Masakazu Kobayashi, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/008,368

(22) Filed: Aug. 31, 2020

(65) Prior Publication Data

US 2021/0305435 A1 Sep. 30, 2021

(30) Foreign Application Priority Data

Mar. 24, 2020 (JP) ............................ JP2020-052531

(51) Int. Cl.
*H01L 29/872* (2006.01)
*H01L 29/06* (2006.01)
(Continued)

(52) U.S. Cl.
CPC .......... *H01L 29/872* (2013.01); *H01L 29/063* (2013.01); *H01L 29/1608* (2013.01); *H01L 29/868* (2013.01)

(58) Field of Classification Search
CPC ............... H01L 29/063; H01L 29/0619; H01L 29/0626; H01L 29/0692;
(Continued)

(56) References Cited

U.S. PATENT DOCUMENTS 9,577,046 B1 2/2017 Hori et al.
10,396,072 B2 8/2019 Hori
(Continued)

FOREIGN PATENT DOCUMENTS

JP 2012204411 A 10/2012
JP 2015029046 A 2/2015
(Continued)

*Primary Examiner* — Shahed Ahmed
(74) *Attorney, Agent, or Firm* — Kim & Stewart LLP

(57) ABSTRACT

A semiconductor device according to an embodiment includes first and second electrode, and semiconductor layer between the first and the second electrode. The semiconductor layer has first and second plane. The semiconductor layer includes first region of first conductivity type, second region of second conductivity type between the first plane and the first region, third region of second conductivity type between the first plane and the first region and, fourth region of second conductivity type between the second and the third region, and fifth region of first conductivity type having first portion provided between the first and the fourth region. Width of the fourth region is larger than that of the second region. Distance between the second region and the first portion is smaller than distance between the second and the fourth region. And width of the first portion is smaller than that of the fourth region.

9 Claims, 7 Drawing Sheets

(51) Int. Cl.
*H01L 29/16* (2006.01)
*H01L 29/868* (2006.01)

(58) Field of Classification Search
CPC ......... H01L 29/872–8725; H01L 2924/12032; H01L 29/66143; H01L 29/66212; H01L 27/0766; H01L 29/6606
See application file for complete search history.

(56) References Cited

U.S. PATENT DOCUMENTS

2009/0302327 A1 12/2009 Rexer et al.
2012/0241762 A1 9/2012 Noda et al.
2015/0001552 A1 1/2015 Hori et al.
2016/0093748 A1* 3/2016 Mieczkowski ....... H01L 29/872 257/77
2016/0284834 A1* 9/2016 Shimizu ................ H01L 21/045
2017/0077218 A1* 3/2017 Nishikawa .......... H01L 29/0619
2017/0271528 A1 9/2017 Oota et al.
2019/0088648 A1 3/2019 Hori
2020/0266268 A1* 8/2020 Uchida ............... H01L 23/3192
2021/0175369 A1* 6/2021 Ohse .................. H01L 29/0692

FOREIGN PATENT DOCUMENTS

JP 6400544 B2 10/2018
JP 6505625 B2 4/2019
JP 2019054193 A 4/2019
WO WO-2016002057 A1 * 1/2016 ......... H01L 29/1608

* cited by examiner

100
TERMINATION REGION
ELEMENT REGION
TERMINATION REGION
SECOND DIRECTION
P1
P2
w1
w2
10
12
14
16
18
20
22
24
26
28
30
32
34
36
p
p+
n
n−
n+

100
A'
A
n⁻
p
p⁺
20
22
24
26
30
34
36
SECOND DIRECTION
FIRST DIRECTION

100
SECOND DIRECTION
THIRD DIRECTION
12
P1
20
18
P2
14
p
22d
p
22b
d4
d3
15
n
28b
26
w1
w4
p+
p
d5
n−
n+
24
dx
w3
n
28a
d2
d6
d1
w2
p
22a
d7
p
22c
10

28
24
26
B'
22
20
p
n
p+
28b
28a
SECOND DIRECTION
FIRST DIRECTION
B

700
TERMINATION REGION
ELEMENT REGION
TERMINATION REGION
P1
P2
10
12
14
16
18
20
22
24
26
30
34
36
p
p+
n−
n+

800
TERMINATION REGION
ELEMENT REGION
TERMINATION REGION
P1
P2
10
12
14
16
18
20
22
24
26
30
34
36
40
p
p+
n
n−
n+

SEMICONDUCTOR DEVICE HAVING SCHOTTKY BARRIER DIODE

CROSS-REFERENCE TO RELATED APPLICATION

This application is based upon and claims the benefit of priority from Japanese Patent Application No. 2020-052531, filed on Mar. 24, 2020, the entire contents of which are incorporated herein by reference.

FIELD

Embodiments described herein relate generally to semiconductor devices.

BACKGROUND

In a Schottky barrier diode (SBD) or a kind of junction barrier Schottky diode (JBS) of the SBD, in some cases, a PiN diode region may be provided in the element region in order to improve the surge current tolerance. The JBS provided with the PiN diode region is called a merged PiN-diode Schottky-diode (MPS).

By providing the PiN diode region in the element region, it is possible to flow a large surge current by using the conductivity modulation of the PiN diode region at the time of forward bias. Therefore, the surge current tolerance is improved.

In addition, in the MPS, a termination structure is provided in the termination region around the element region in order to relax the electric field strength in the end of the element region at the time of reverse bias and increase the breakdown voltage. The termination structure is, for example, a RESURF or a guard ring.

From the viewpoint of suppressing the element breakdown due to the surge voltage applied in the reverse bias direction, it is preferable that the breakdown voltage of the element region is lower than the breakdown voltage of the termination structure. By causing breakdown in the element region having an area larger than that of the termination structure, current concentration at the time of breakdown is suppressed, and thus, element breakdown is suppressed. Therefore, the tolerance to surge voltage (hereinafter, referred to as a surge voltage tolerance) is improved.

DETAILED DESCRIPTION

Figure 1:
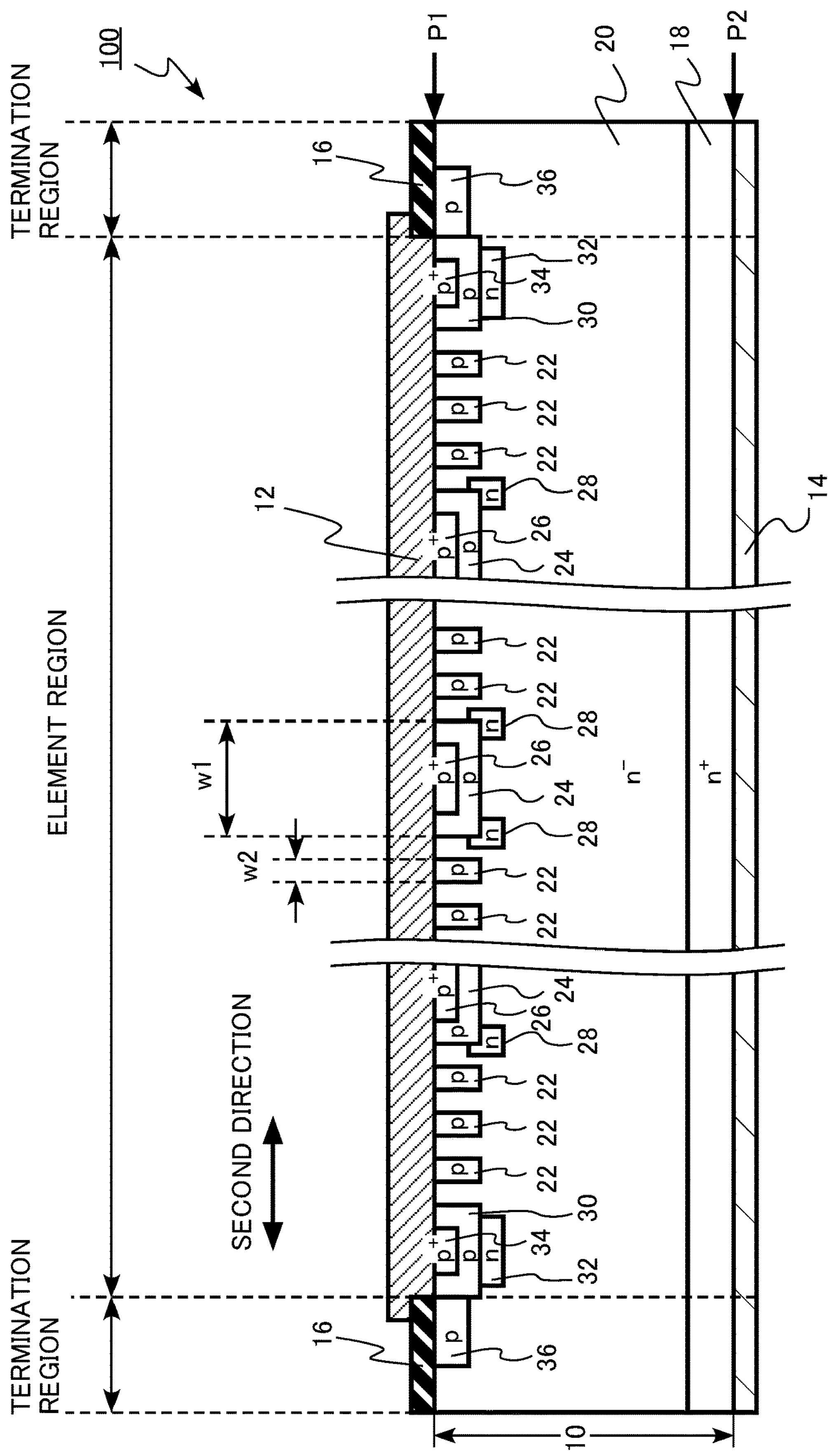
FIG. 1 is a schematic cross-sectional view of a semiconductor device according to an embodiment.

A semiconductor device according to an embodiment includes: a first electrode; a second electrode; and a semiconductor layer being provided between the first electrode and the second electrode, the semiconductor layer having a first plane in contact with the first electrode and a second plane in contact with the second electrode, the semiconductor layer including: a first semiconductor region of a first conductivity type being in contact with the first electrode; a second semiconductor region of a second conductivity type being provided between the first plane and the first semiconductor region, the second semiconductor region extending in a first direction parallel to the first plane and being in contact with the first electrode; a third semiconductor region of the second conductivity type being provided between the first plane and the first semiconductor region, the third semiconductor region extending in the first direction and being in contact with the first electrode; a fourth semiconductor region of the second conductivity type being provided between the first plane and the first semiconductor region, the fourth semiconductor region being interposed between the second semiconductor region and the third semiconductor region and being electrically connected to the first electrode; and a fifth semiconductor region of the first conductivity type being provided between the first semiconductor region and the fourth semiconductor region, a first conductivity type impurity concentration being higher than a first conductivity type impurity concentration of the first semiconductor region, the fifth semiconductor region including a first portion, in which a first width of the fourth semiconductor region in a second direction parallel to the first plane and perpendicular to the first direction is larger than a second width of the second semiconductor region in the second direction, in which a first distance between the second semiconductor region and the first portion in the second direction parallel to the first plane and perpendicular to the first direction is smaller than a second distance between the second semiconductor region and the fourth semiconductor region in the second direction, and in which a third width of the first portion in the second direction is smaller than the first width.

Hereinafter, embodiments will be described with reference to the drawings. In the following description, the same or similar members will be denoted by the same reference numerals, and the description of members and the like described once will be appropriately omitted.

In addition, in this specification, in some cases, the terms "upper" or "lower" may be used for convenience. "Upper" or "lower" is a term indicating a relative positional relationship in the drawings, and is not a term defining the positional relationship with respect to gravity.

In addition, in the following description, in a case where there are notations of $n^+$, n, $n^-$ and $p^+$, p, $p^-$, the notation indicates the relative level of the impurity concentration of each conductivity type. That is, $n^+$ indicates that the n-type impurity concentration is relatively higher than that of n, and $n^-$ indicates that the n-type impurity concentration is relatively lower than that of n. In addition, $p^+$ indicates that the p-type impurity concentration is relatively higher than that of p, and $p^-$ indicates that the p-type impurity concentration is relatively lower than that of p. Furthermore, in some cases, the $n^+$-type and the n-type may be simply referred to as the n type, and the $p^+$-type and the p-type may be simply referred to as the p type.

Qualitative and quantitative analyses of the chemical composition of the members constituting the semiconductor device in this specification can be performed by, for example, secondary ion mass spectroscopy (SIMS), energy dispersive X-ray spectroscopy (EDX) and a three-dimensional atom probe. In addition, for example, a transmission electron microscope (TEM) can be used to measure the thickness of the members constituting the semiconductor device, the distance between the members, and the like.

Hereinafter, embodiments will be described with reference to the drawings. In the following description, the same members and the like will be denoted by the same reference numerals, and the description of the members and the like described once will be appropriately omitted.

A semiconductor device according to an embodiment includes: a first electrode; a second electrode; and a semiconductor layer being provided between the first electrode and the second electrode, the semiconductor layer having a first plane in contact with the first electrode and a second plane in contact with the second electrode, the semiconductor layer including: a first semiconductor region of a first conductivity type being in contact with the first electrode; a second semiconductor region of a second conductivity type being provided between the first plane and the first semiconductor region, the second semiconductor region extending in a first direction parallel to the first plane and being in contact with the first electrode; a third semiconductor region of the second conductivity type being provided between the first plane and the first semiconductor region, the third semiconductor region extending in the first direction and being in contact with the first electrode; a fourth semiconductor region of the second conductivity type being provided between the second semiconductor region and the third semiconductor region, the fourth semiconductor region being electrically connected to the first electrode; and a fifth semiconductor region of the first conductivity type being provided between the first semiconductor region and the fourth semiconductor region, a first conductivity type impurity concentration being higher than a first conductivity type impurity concentration of the first semiconductor region, the fifth semiconductor region including a first portion, in which a first width of the fourth semiconductor region in a second direction parallel to the first plane and perpendicular to the first direction is larger than a second width of the second semiconductor region in the second direction, in which a first distance between the second semiconductor region and the first portion in the second direction parallel to the first plane and perpendicular to the first direction is smaller than a second distance between the second semiconductor region and the fourth semiconductor region in the second direction, and in which a third width of the first portion in the second direction is smaller than the first width.

Figure 2:
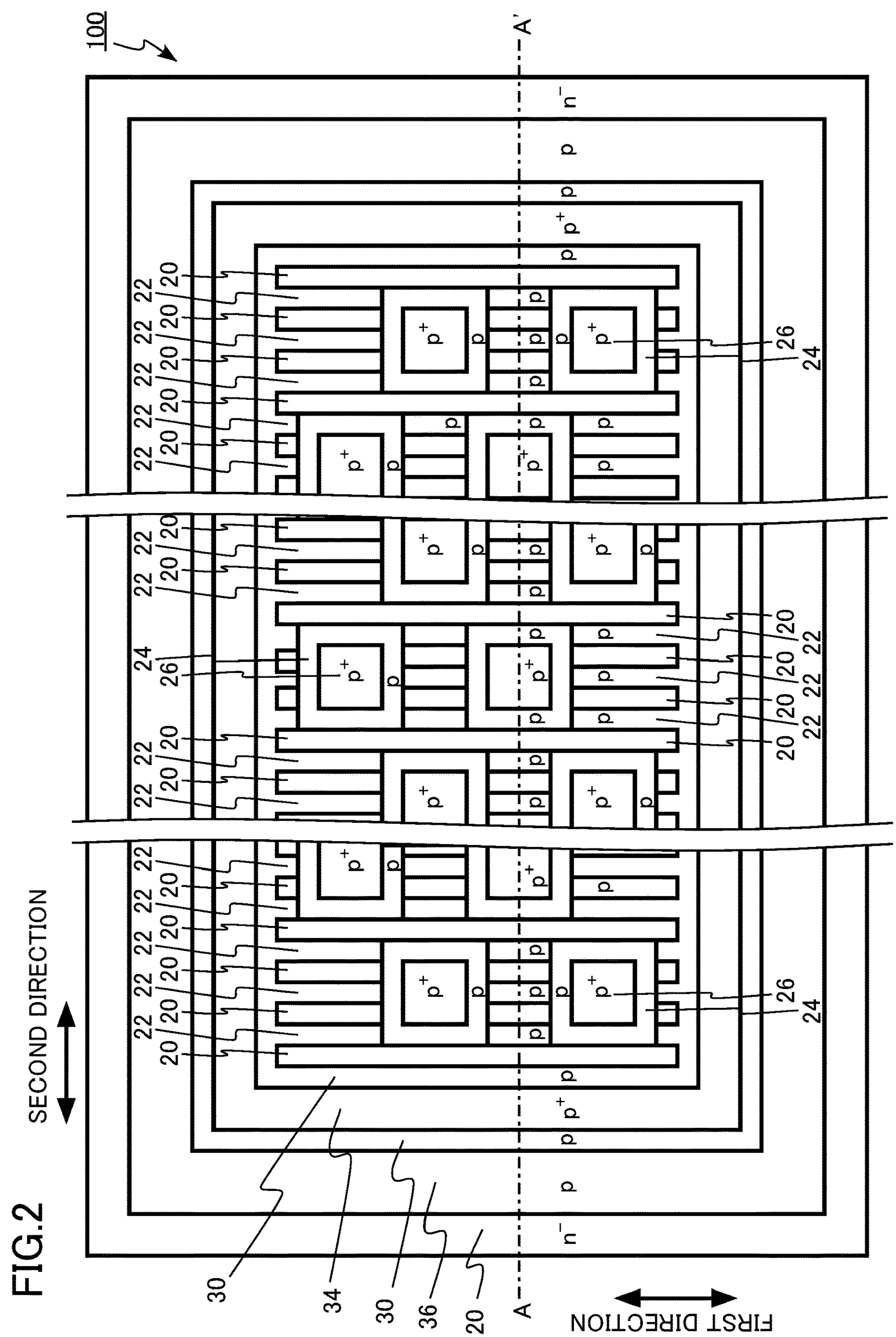
FIG. 2 is a schematic top view of the semiconductor device according to the embodiment.

FIG. 1 is a schematic cross-sectional view of the semiconductor device according to the embodiment. FIG. 2 is a schematic top view of the semiconductor device according to the embodiment. FIG. 2 illustrates a pattern layout of the impurity region on the first plane side of the semiconductor layer. FIG. 1 corresponds to the cross section taken along the line AA' of FIG. 2.

Figure 3:
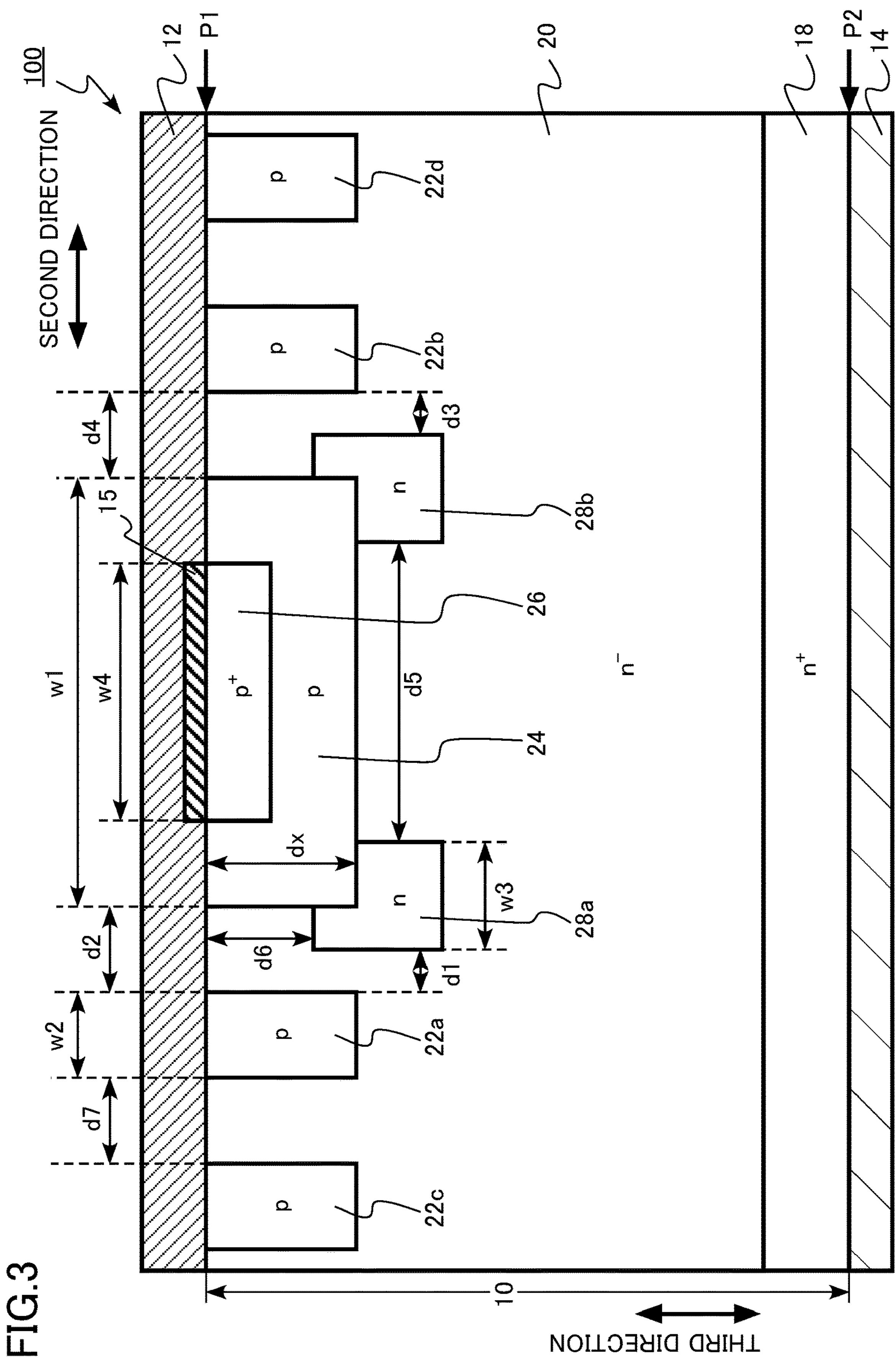
FIG. 3 is an enlarged cross-sectional view of a portion of the semiconductor device according to the embodiment.
Figure 4:
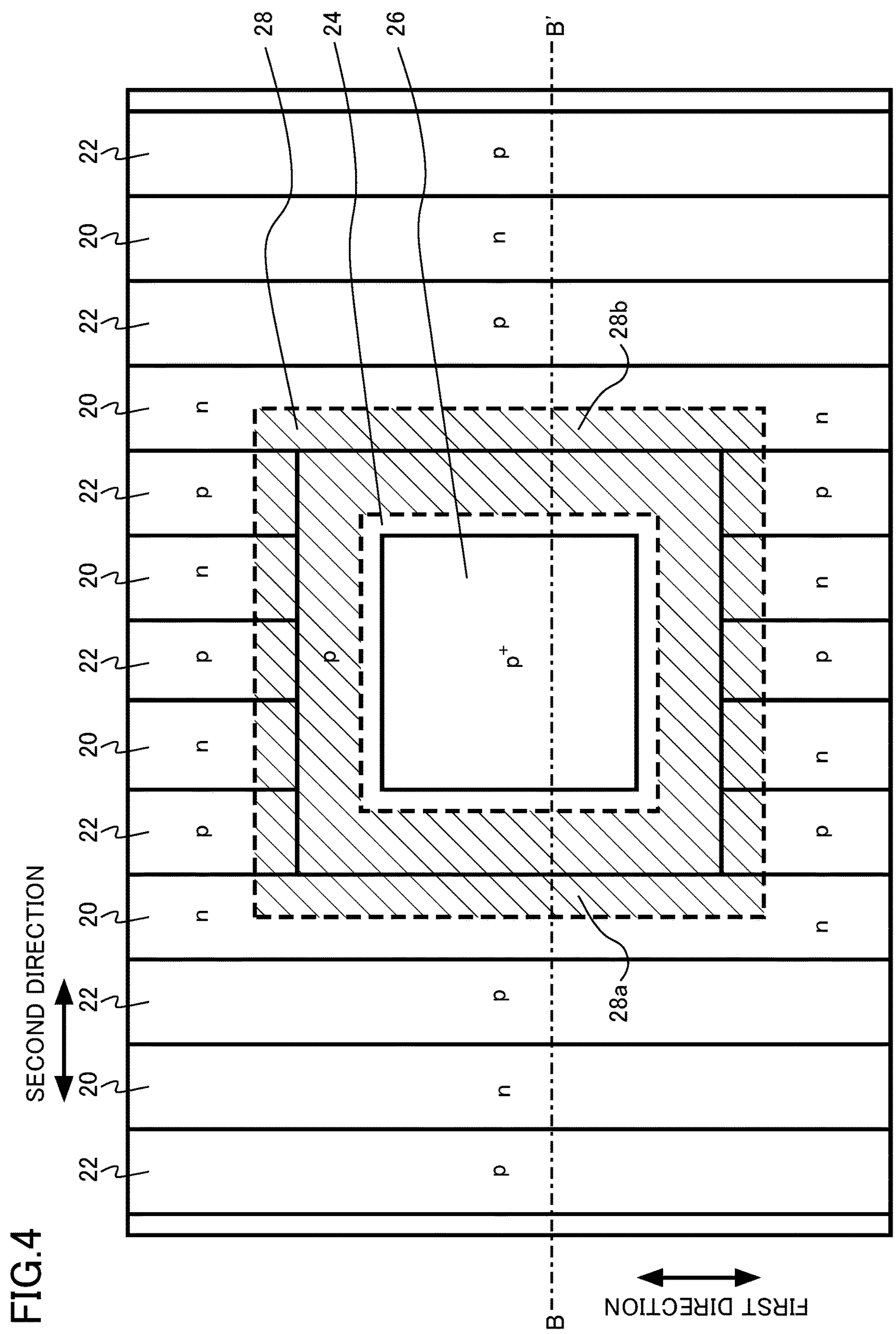
FIG. 4 is an enlarged top view of a portion of the semiconductor device according to the embodiment.

FIG. 3 is an enlarged cross-sectional view of a portion of the semiconductor device according to the embodiment. FIG. 4 is an enlarged top view of a portion of the semiconductor device according to the embodiment. FIG. 3 corresponds to the cross section taken along the line BB' of FIG. 4.

The semiconductor device according to the embodiment is an MPS 100. As illustrated in FIG. 2, the MPS 100 has an element region and a termination region. The element region is surrounded by the termination region.

The element region mainly functions as a region in which a current flows at the time of forward bias of the MPS 100. The termination region functions as a region of reducing the strength of the electric field applied to the end portion of the element region at the time of reverse bias of the MPS 100 and improving the element breakdown voltage of the MPS 100.

The MPS 100 includes an SiC layer 10 (semiconductor layer), an anode electrode 12 (first electrode), a cathode electrode 14 (second electrode), a silicide layer 15 (metal semiconductor compound layer), and a field oxide film 16. The SiC layer 10 has a first plane (P1 in FIG. 1) and a second plane (P2 in FIG. 1). SiC layer 10 is a silicon carbide layer.

The SiC layer 10 includes an $n^+$-type cathode region 18, an $n^-$-type drift region 20 (first semiconductor region), a plurality of p-type stripe regions 22, a p-type anode region 24 (fourth semiconductor region), $p^+$-type cell contact region 26, n-type edge region 28 (fifth semiconductor region), p-type first peripheral region 30 (seventh semiconductor region), n-type second peripheral region 32 (eighth semiconductor region), a $p^+$-type peripheral contact region 34, and a p-type RESURF region 36.

The plurality of stripe regions 22 include a first stripe region 22*a* (second semiconductor region), a second stripe region 22*b* (third semiconductor region), a third stripe region 22*c* (sixth semiconductor region), a fourth stripe regions 22*d*. The n-type edge region 28 includes a first portion 28*a* and a second portion 28*b*.

The cathode region 18, the drift region 20, the stripe region 22, the anode region 24, the cell contact region 26, the edge region 28, the first peripheral region 30, the second peripheral region 32, and the peripheral contact region 34 are provided in the element region. The RESURF region 36 is provided in the termination region.

At least a portion of the SiC layer 10 is provided between the anode electrode 12 and the cathode electrode 14. Anode electrode 12 is provided on the first plane P1 of SiC layer 10. The anode electrode 12 is in contact with the first plane P1. The cathode electrode 14 is provided on the second plane P2 of SiC layer 10. The cathode electrode 14 is in contact with the second plane P2. The field oxide film 16 is provided on the first plane of SiC layer 10.

The SiC layer 10 is made of a single crystal SiC (silicon carbide). The SiC layer 10 is made of, for example, 4H—SiC. A case where the first plane of the SiC layer 10 is a plane inclined by 0 degrees or more and 8 degrees or less with respect to the (0001) plane and the second plane is a plane inclined by 0 degrees or more and 8 degrees or less with respect to the (000-1) plane will be described as an example. The (0001) plane is called a silicon plane. The (000-1) plane is called a carbon plane.

The $n^+$-type cathode region 18 is provided between the cathode electrode 14 and the $n^-$-type drift region 20.

The cathode region 18 contains n-type impurities. The n-type impurity is, for example, nitrogen (N). The n-type impurity concentration of the cathode region 18 is higher than the n-type impurity concentration of the drift region 20. The n-type impurity concentration is, for example, $1\times10^{18}$ $cm^{-3}$ or more and $1\times10^{21}$ $cm^{-3}$ or less.

The $n^-$-type drift region 20 is provided on the cathode region 18. The drift region 20 is provided between the cathode region 18 and the first plane P1. The drift region 20 functions as a region in which carriers flow.

A portion of the drift region 20 is in contact with the anode electrode 12 on the first plane P1.

The contact between the anode electrode 12 and the drift region 20 is a Schottky contact. A region where the anode electrode 12 and the drift region 20 are in contact with each other becomes a Schottky region in which an on-current flows at the time of forward bias.

The drift region 20 contains n-type impurities. The n-type impurity is, for example, nitrogen (N). The n-type impurity concentration of the drift region 20 is, for example, $1\times10^{15}$ $cm^{-3}$ or more and $2\times10^{16}$ $cm^{-3}$ or less. The thickness of the drift region 20 is, for example, 3 μm or more and 30 μm or less.

In addition, an n-type buffer layer (not illustrated) may be provided between the cathode region 18 and the n-type drift region 20. The n-type impurity concentration of the n-type buffer layer is a concentration between the n-type impurity concentration of the cathode region 18 and the n-type impurity concentration of the drift region 20.

The plurality of p-type stripe regions 22 are provided between the first plane P1 and the drift region 20. The stripe region 22 is provided between the anode electrode 12 and the drift region 20. The stripe region 22 is in contact with the anode electrode 12 on the first plane P1.

The stripe region 22 has a stripe shape. As illustrated in FIG. 2, the stripe region 22 extends in the first direction parallel to the first plane P1. A portion of the stripe region 22 is in contact with the anode region 24.

The stripe regions 22 are repeatedly disposed in the second direction, which is parallel to the first plane P1 and is perpendicular to the first direction. The drift region 20 is interposed between two adjacent stripe regions 22. The drift region 20 interposed between the two stripe regions 22 extends in the first direction.

The stripe region 22 has a function of suppressing a leak current at the time of reverse bias. At the time of reverse bias, the depletion layer spreads in the drift region 20 between the two stripe regions 22, and the drift region 20 is pinched off. Therefore, the electric field between the anode electrode 12 and the drift region 20 is relaxed, and the leak current of the MPS 100 is suppressed.

The width w2 (w2 in FIGS. 1 and 3) of the stripe region 22 is, for example, 0.5 μm or more and 3.0 μm or less. The distance between the stripe regions 22 and the stripe regions 22 is, for example, 1.0 μm or more and 6.0 μm or less.

The depth of the stripe region 22 with respect to the first plane P1 as a reference is, for example, 0.2 μm or more and 1.5 μm or less.

The stripe region 22 contains p-type impurities. The p-type impurity is, for example, aluminum (Al).

The p-type impurity concentration of the stripe region 22 is, for example, equal to the p-type impurity concentration of the anode region 24. The impurity concentration of the p-type impurities in the stripe region 22 is, for example, $5\times10^{16}$ $cm^{-3}$ or more and $1\times10^{19}$ $cm^{-3}$ or less.

The stripe region 22 is, for example, formed simultaneously with the anode region 24 in the same process step.

The p-type anode region 24 is provided between the first plane P1 and the drift region 20. The anode region 24 is provided between the anode electrode 12 and the drift region 20. The anode region 24 is electrically connected to the anode electrode 12.

The anode region 24 contains p-type impurities. The p-type impurity is, for example, aluminum (Al). The p-type impurity concentration of the anode region 24 is, for example, $5\times10^{16}$ $cm^{-3}$ or more and $5\times10^{18}$ $cm^{-3}$ or less.

The width (w1 in FIGS. 1 and 3) of the anode region 24 is larger than the width (w2 in FIGS. 1 and 3) of the stripe region 22. That is, w1>w2. The width w1 of the anode region 24 is, for example, 3.0 μm or more and 60 μm or less.

The depth of the anode region 24 with respect to the first plane P1 as a reference is, for example, 0.2 μm or more and 1.5 μm or less.

The region where the anode region 24 exists forms a PiN diode region. The PiN diode region allows a large amount of current to flow by using conductivity modulation by hole injection when a forward surge current occurs. Therefore, the PiN diode region has a function of suppressing the MPS 100 from being destroyed by heat generation or the like. Due to the existence of the PiN diode region, the surge current tolerance is improved.

The $p^+$-type cell contact region 26 is provided between the first plane P1 and the anode region 24. The cell contact region 26 is provided between the anode electrode 12 and the anode region 24. The cell contact region 26 is provided between the silicide layer 15 and the anode region 24.

The cell contact region 26 is provided in the anode region 24. The cell contact region 26 is surrounded by the anode region 24.

The cell contact region 26 is in contact with the silicide layer 15. The contact between the silicide layer 15 and the cell contact region 26 is an ohmic contact.

The cell contact region 26 contains p-type impurities. The p-type impurity is, for example, aluminum (Al). The p-type impurity concentration of the cell contact region 26 is higher than the p-type impurity concentration of the anode region 24. The p-type impurity concentration of the cell contact region 26 is, for example, $1\times10^{19}$ $cm^{-3}$ or more and $1\times10^{21}$ $cm^{-3}$ or less.

The depth with respect to the first plane P1 of the cell contact region 26 as a reference is, for example, 0.05 μm or more and 0.5 μm or less.

The n-type edge region 28 is provided between the drift region 20 and the anode region 24. The edge region 28 is provided in the end of the anode region 24 in the second direction. The edge region 28 is in contact with the anode region 24.

The edge region 28 has a function of increasing the electric field strength in the end of the anode region 24 at the time of reverse bias. By providing the edge region 28, the breakdown voltage of the element region is reduced.

The n-type edge region 28 contains n-type impurities. The n-type impurity is, for example, nitrogen (N). The n-type impurity concentration of the edge region 28 is higher than the n-type impurity concentration of the drift region 20. The n-type impurity concentration of the edge region 28 is, for example, lower than the n-type impurity concentration of the second peripheral region 32. The n-type impurity concentration of the edge region 28 is, for example, $1\times10^{16}$ $cm^{-3}$ or more and $1\times10^{18}$ $cm^{-3}$ or less.

The depth of the edge region 28 with respect to the first plane P1 as a reference is, for example, 0.6 μm or more and 2.0 μm or less.

As illustrated in FIG. 3, the plurality of stripe regions 22 includes a first stripe region 22*a* (second semiconductor region), a second stripe region 22*b* (third semiconductor region), and a third stripe region 22*c* (sixth semiconductor region), and a fourth stripe region 22*d*. The n-type edge region 28 includes a first portion 28*a* and a second portion 28*b*.

The anode region 24 (fourth semiconductor region) is interposed between the first stripe region 22*a* and the second stripe region 22*b*.

The third stripe region 22*c* is adjacent to the first stripe region 22*a*. The third stripe region 22*c* and the anode region 24 interpose the first stripe region 22*a*.

The fourth stripe region 22*d* is adjacent to the second stripe region 22*b*. The fourth stripe region 22*d* and the anode region 24 interpose the second stripe region 22*b*.

The distance (d1 in FIG. 3) between the first stripe region 22*a* and the first portion 28*a* of the edge region 28 in the second direction is smaller than the distance (d2 in FIG. 3) between the first stripe region 22*a* and the anode region 24 in the second direction. In other words, the edge region 28 projects outward with respect to the end of the anode region 24 in the second direction.

The width (w3 in FIG. 3) of the first portion 28*a* of the edge region 28 in the second direction is smaller than the width w1 of the anode region 24 in the second direction. Therefore, on the bottom surface of the anode region 24, there is a region where the first portion 28*a* does not exist.

The distance (d3 in FIG. 3) between the second stripe region 22*b* and the second portion 28*b* of the edge region 28 in the second direction is smaller than the distance (d4 in FIG. 3) between the second stripe region 22*b* and the anode region 24 in the second direction. In other words, the edge region 28 projects outward with respect to the end of the anode region 24 in the second direction.

The second portion 28*b* includes the drift region 20 between the first portion 28*a* and the second portion 28*b*. The drift region 20 exists between the first portion 28*a* and the second portion 28*b*. Therefore, on the bottom surface of the anode region 24, there is a region where neither the first portion 28*a* nor the second portion 28*b* is in contact. Between the bottom surface of the anode region 24 and the drift region 20, there is a region where the edge region 28 does not exist.

The distance (d5 in FIG. 3) between the first portion 28*a* and the second portion 28*b* in the second direction is, for example, larger than the width (w4 in FIG. 3) of the silicide layer 15 in the second direction. The width d5 of the region where the edge region 28 does not exist between the bottom surface of the anode region 24 and the drift region 20 in the second direction is, for example, larger than the width w4 of the silicide layer 15 in the second direction.

The first portion 28*a* is separated from the first plane P1. The first portion 28*a* is not in contact with the anode electrode 12.

The distance (d6 in FIG. 3) between the first portion 28*a* and the first plane P1 is smaller than the depth (dx in FIG. 3) of the anode region 24 with respect to the first plane P1 as a reference. Therefore, the first portion 28*a* is formed so as to cover the corner portion between the bottom surface and the side surface of the anode region 24. Similarly, the second portion 28*b* is formed so as to cover the corner portion between the bottom surface and the side surface of the anode region 24.

The distance d2 between the first stripe region 22*a* and the anode region 24 in the second direction is, for example, smaller than the distance (d7 in FIG. 3) between the third stripe region 22*c* and the first stripe region 22*a* in the second direction. The distance between the anode region 24 and the adjacent stripe regions 22 is, for example, smaller than the distance between the stripe regions 22 and the stripe regions 22.

As illustrated in FIG. 4, the shape of the edge region 28 viewed from the third direction perpendicular to the first plane P1 is annular. In FIG. 4, the edge region 28 is not exposed to the first plane P1. The edge region 28 illustrated in FIG. 4 is a pattern projected on the first plane P1. In FIG. 4, the edge region 28 is a hatched portion interposed by broken lines. The edge region 28 surrounds the anode region 24.

The p-type first peripheral region 30 is provided between the first plane P1 and the drift region 20. The first peripheral region 30 is provided between the anode electrode 12 and the drift region 20.

The first peripheral region 30 surrounds the first stripe region 22*a*, the second stripe region 22*b*, and the anode region 24. The first peripheral region 30 surrounds the plurality of stripe regions 22.

The first peripheral region 30 is provided in an annular shape on the outer peripheral portion of the element region. The first peripheral region 30 is, for example, formed simultaneously with the anode region 24 in the same process step.

The first peripheral region 30 contains p-type impurities. The p-type impurity is, for example, aluminum (Al). The p-type impurity concentration of the first peripheral region 30 is, for example, $5\times10^{16}$ $cm^{-3}$ or more and $5\times10^{18}$ $cm^{-3}$ or less.

The depth with respect to the first plane P1 of the first peripheral region 30 as a reference is, for example, 0.2 μm or more and 1.5 μm or less. The depth of the first peripheral region 30 is, for example, equal to the depth of the anode region 24.

The n-type second peripheral region 32 is provided between the drift region 20 and the first peripheral region 30. The second peripheral region 32 is in contact with the first peripheral region 30.

The second peripheral region 32 has a function of increasing the electric field strength of the bottom surface of the first peripheral region 30 at the time of reverse bias. By providing the second peripheral region 32, the breakdown voltage in the peripheral portion of the element region is reduced.

The second peripheral region 32 contains n-type impurities. The n-type impurity is, for example, nitrogen (N). The n-type impurity concentration of the second peripheral region 32 is higher than the n-type impurity concentration of the drift region 20. The n-type impurity concentration of the second peripheral region 32 is, for example, higher than the n-type impurity concentration of the edge region 28. The n-type impurity concentration of the second peripheral region 32 is, for example, $1\times10^{16}$ $cm^{-3}$ or more and $1\times10^{18}$ $cm^{-3}$ or less.

The depth of the second peripheral region 32 with respect to the first plane P1 as a reference is, for example, 0.6 μm or more and 2.0 μm or less.

The $p^+$-type peripheral contact region 34 is provided between the anode electrode 12 and the first peripheral region 30. The peripheral contact region 34 is provided in the first peripheral region 30.

The peripheral contact region 34 is in contact with the anode electrode 12. The contact between the anode electrode 12 and the peripheral contact region 34 is an ohmic contact.

The peripheral contact region 34 is provided, for example, in an annular shape on the outer peripheral portion of the element region. The peripheral contact region 34 is, for example, formed simultaneously with the cell contact region 26 in the same process step.

The peripheral contact region 34 contains p-type impurities. The p-type impurity is, for example, aluminum (Al). The p-type impurity concentration of the peripheral contact region 34 is higher than the p-type impurity concentration of the first peripheral region 30. The p-type impurity concentration of the peripheral contact region 34 is, for example, $1\times10^{19}$ $cm^{-3}$ or more and $1\times10^{21}$ $cm^{-3}$ or less.

The depth of the peripheral contact region 34 with respect to the first plane P1 as a reference is, for example, 0.05 μm or more and 0.5 μm or less.

The p-type RESURF region 36 is provided between the first plane P1 and the drift region 20. The RESURF region 36 is provided between the field oxide film 16 and the drift region 20.

The RESURF region 36 is provided so as to surround the first peripheral region 30. The RESURF region 36 is electrically connected to the anode electrode 12. The RESURF region 36 is provided in the termination region.

The RESURF region 36 has a junction termination extension (JTE) structure for improving the breakdown voltage of the MPS 100.

The RESURF region 36 contains p-type impurities. The p-type impurity is, for example, aluminum (Al). The p-type impurity concentration of the RESURF region 36 is, for example, $1\times10^{16}$ $cm^{-3}$ or more and $1\times10^{18}$ $cm^{-3}$ or less.

The field oxide film 16 is provided on the RESURF region 36. The field oxide film 16 is, for example, a silicon oxide film. The field oxide film 16 has an opening. The film thickness of the field oxide film 16 is, for example, 0.2 μm or more and 1.0 μm or less.

The anode electrode 12 is in contact with the n-type drift region 20, the p-type stripe region 22, and the silicide layer 15 at the opening of the field oxide film 16.

The anode electrode 12 is made of a metal. The anode electrode 12 is, for example, a stacked film of titanium (Ti) and aluminum (Al).

The silicide layer 15 is provided between the anode electrode 12 and the p+-type cell contact region 26 and between the anode electrode 12 and the p+-type peripheral contact region 34. By providing the silicide layer 15, the contact resistance is reduced, and thus, an ohmic contact is realized.

The silicide layer 15 is, for example, nickel silicide or titanium silicide. The thickness of the silicide layer 15 is, for example, 0.05 μm or more and 0.3 μm or less.

The cathode electrode 14 is provided in contact with the $n^+$-type cathode region 18. The contact between the cathode electrode 14 and the cathode region 18 is an ohmic contact.

The cathode electrode 14 is made of a metal. The cathode electrode 14 is, for example, a stacked film of nickel (Ni) and titanium (Ti).

Next, the function and effect of the embodiment will be described.

In the MPS, a PiN diode region is provided in the element region. The MPS can flow a large surge current by using the conductivity modulation of the PiN diode region at the time of forward bias. Therefore, the surge current tolerance is improved.

In addition, in the MPS, a termination structure is provided in the termination region around the element region in order to relax the electric field strength in the end of the element region at the time of reverse bias and increase the breakdown voltage. The termination structure is, for example, a RESURF or a guard ring.

From the viewpoint of suppressing element breakdown due to the surge voltage applied in the reverse bias direction, it is preferable that the breakdown voltage of the element region is lower than the breakdown voltage of the termination structure. By causing breakdown in the element region having an area larger than that of the termination structure, current concentration at the time of breakdown is suppressed, and thus, element breakdown is suppressed. Therefore, the surge voltage tolerance is improved.

Figure 5:
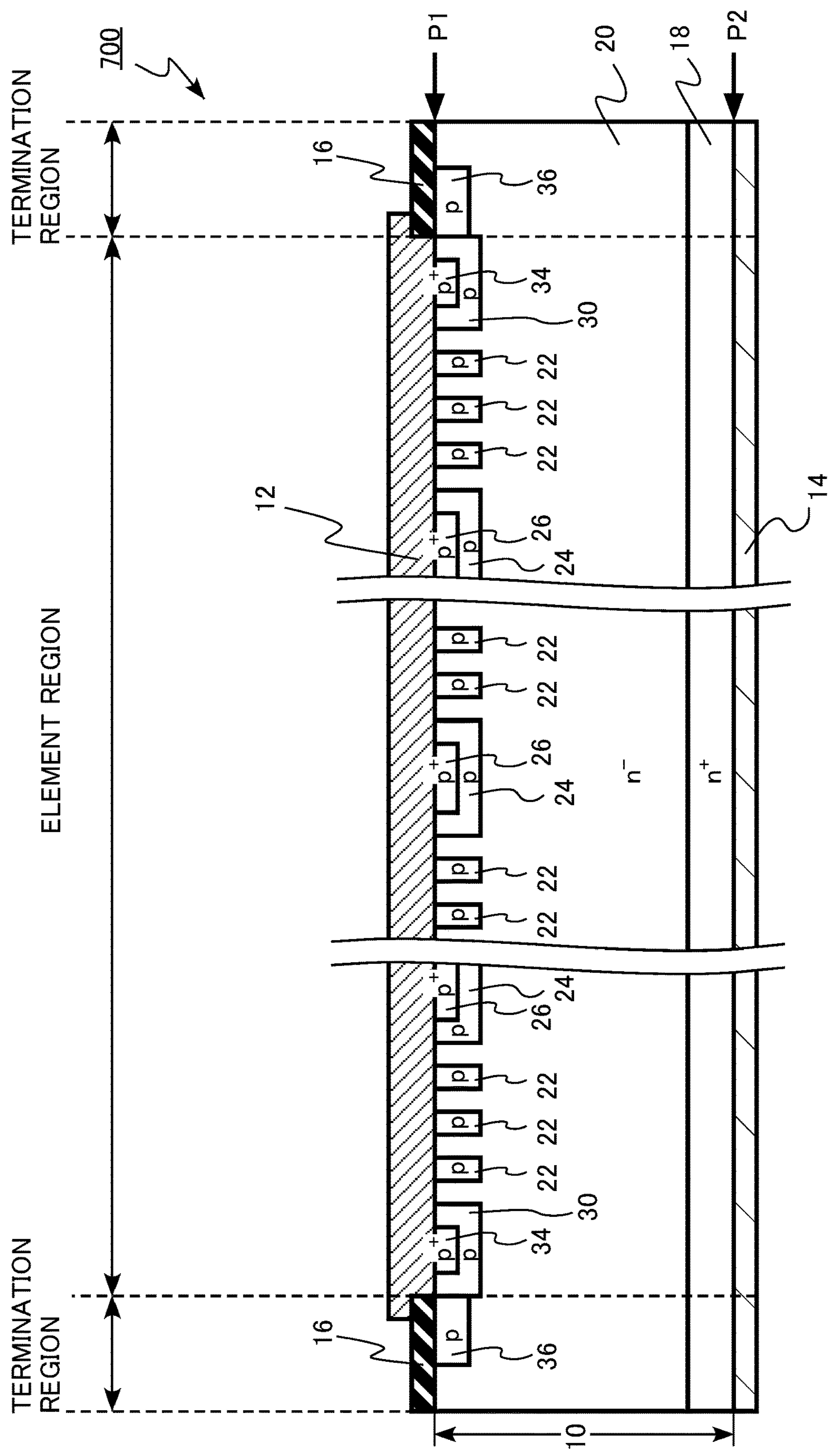
FIG. 5 is a schematic cross-sectional view of a semiconductor device according to Comparative Example 1.

FIG. 5 is a schematic cross-sectional view of the semiconductor device according to Comparative Example 1. FIG. 5 is a diagram corresponding to FIG. 1 of the embodiment.

The semiconductor device according to Comparative Example 1 is an MPS 700. The MPS 700 is different from the MPS 100 according to the embodiment in that the MPS 700 does not include the n-type edge region 28.

In the MPS 700, the breakdown voltage of the anode region 24 becomes higher than the breakdown voltage of the termination structure, and thus, there is a concern that the surge voltage tolerance is reduced.

Figure 6:
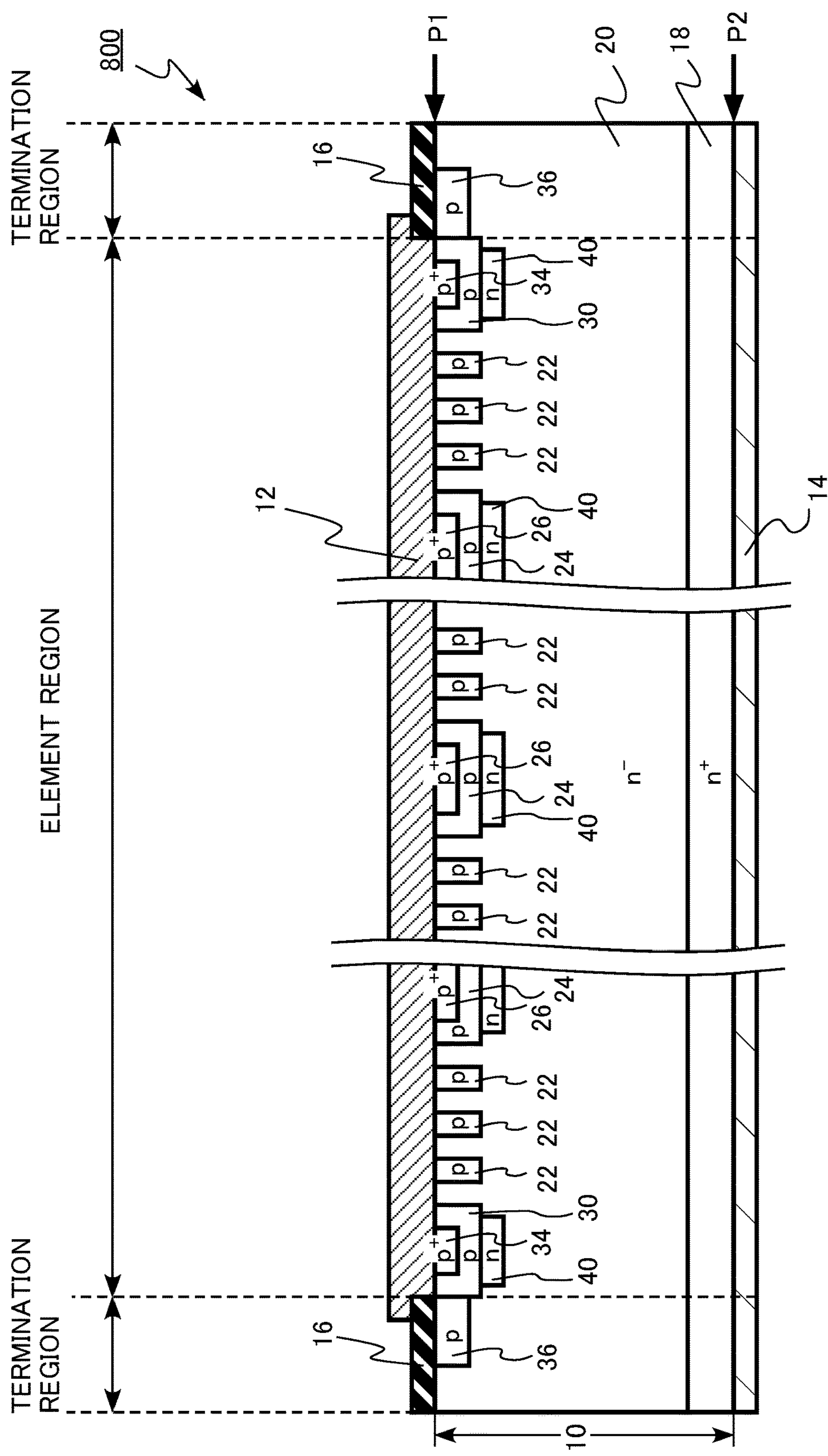
FIG. 6 is a schematic cross-sectional view of a semiconductor device according to Comparative Example 2.

FIG. 6 is a schematic cross-sectional view of the semiconductor device according to Comparative Example 2. FIG. 6 is a diagram corresponding to FIG. 1 of the embodiment.

The semiconductor device according to Comparative Example 2 is an MPS 800. The MPS 800 is different from the MPS 700 according to Comparative Example 1 in that the MPS 800 has an n-type bottom region 40.

The n-type bottom region 40 is provided between the drift region 20 and the anode region 24, and between the drift region 20 and the p-type first peripheral region 30. By providing the bottom region 40, the electric field strength applied to the pn junction between the anode region 24 and the drift region 20 and between the first peripheral region 30 and the drift region 20 at the time of reverse bias increases. Therefore, the electric field strength at the bottoms of the anode region 24 and the first peripheral region 30 increases. Therefore, by providing the bottom region 40, the breakdown voltage of the anode region 24 and the first peripheral region 30 is reduced. Therefore, as compared with the MPS 700 according to Comparative Example 1, the surge voltage tolerance is improved.

On the other hand, by providing the n-type bottom region 40 in the bottom of the anode region 24, the barrier against holes between the anode region 24 and the drift region 20 becomes high at the time of forward bias of the MPS. For this reason, hole injection from the anode region 24 to the drift region 20 is hindered. Therefore, conductivity modulation in the PiN diode region is less likely to occur, and thus, the amount of the surge current that can be flown is reduced. Therefore, there is a concern that the surge current tolerance is reduced.

Figure 7:
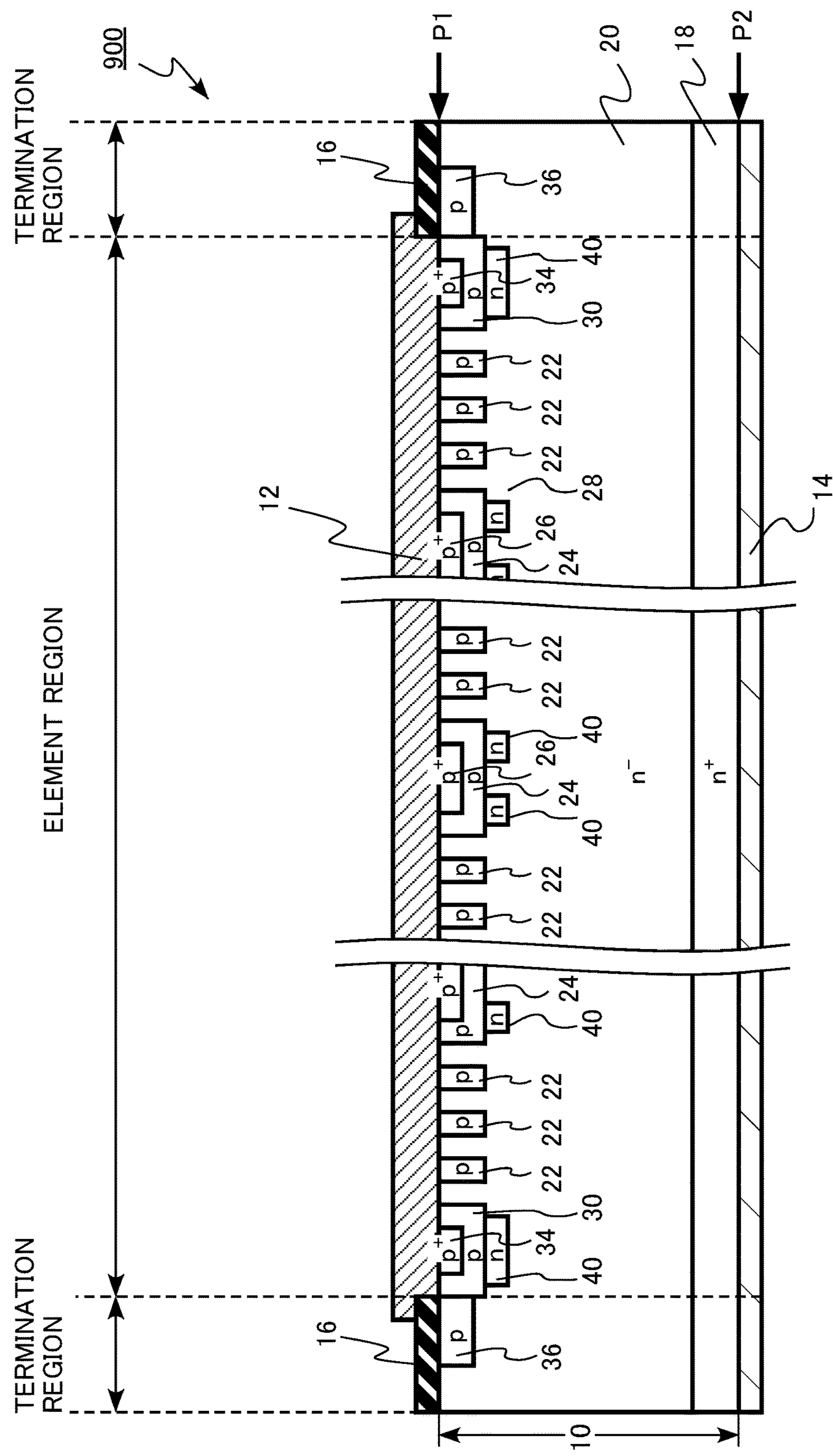
FIG. 7 is a schematic cross-sectional view of a semiconductor device according to Comparative Example 3.

FIG. 7 is a schematic cross-sectional view of the semiconductor device according to Comparative Example 3. FIG. 7 is a diagram corresponding to FIG. 1 of the embodiment.

The semiconductor device according to Comparative Example 3 is an MPS 900. The MPS 900 is different from the MPS 800 according to Comparative Example 2 in that the n-type bottom region 40 is divided.

In the MPS 900, by dividing the n-type bottom region 40, the area of the region which is in contact with the drift region 20 out of the bottom surface of the anode region 24 becomes larger than that of the MPS 800. Therefore, as compared with the MPS 800, a larger surge current can flow. Therefore, as compared with the MPS 800, the surge current tolerance is improved.

On the other hand, since the contact area between the n-type bottom region 40 and the bottom surface of the anode region 24 decreases, the breakdown voltage of the anode region 24 increases. Therefore, there is a concern that the surge voltage tolerance may decrease.

In the MPS 100 according to the embodiment, the n-type edge region 28 is provided in the end of the anode region 24 in the second direction. The n-type edge region 28 is formed in a corner between the bottom surface and the side surface of the anode region 24.

The electric field strength applied to the pn junction between the anode region 24 and the drift region 20 at the time of reverse bias becomes large especially in the corner between the bottom surface and the side surface of the anode region 24 due to the shape effect.

Therefore, by forming the n-type edge region 28 in the corner between the bottom surface and the side surface of the anode region 24, as compared with the case where the n-type region is provided only on the bottom surface of the anode region 24 as in the MPS 800 or MPS 900, the breakdown voltage of the anode region 24 can be effectively reduced. Therefore, according to the MPS 100 according to the embodiment, improvement of the surge current tolerance at the time of forward bias and improvement of the surge voltage tolerance at the time of reverse bias can be achieved simultaneously.

From the viewpoint of reducing the breakdown voltage of the anode region 24, the edge region 28 is preferably formed so as to cover the corner portion between the bottom surface and the side surface of the anode region 24. Therefore, the distance (d6 in FIG. 3) between the first portion 28*a* and the first plane P1 is preferably smaller than the depth (dx in FIG. 3) of the anode region 24 with respect to the first plane P1 as a reference.

From the viewpoint of flowing a large forward surge current, it is preferable that the area of the region which is in contact with the drift region 20 out of the bottom surface of the anode region 24 is large. Therefore, the distance (d5 in FIG. 3) between the first portion 28*a* of the n-type edge region 28 and the second portion 28*b* of the n-type edge region 28 in the second direction is preferably larger than the width (w4 in FIG. 3) of the silicide layer 15 in the second direction.

From the viewpoint of flowing a large forward surge current, it is preferable that the n-type edge region 28 has a low n-type impurity concentration. Therefore, it is preferable that the n-type impurity concentration of the edge region 28 is lower than the n-type impurity concentration of the second peripheral region 32.

When the first portion 28*a* of the n-type edge region 28 is in contact with the anode electrode 12, there is a concern that the leak current at the time of reverse bias of the MPS 100 will increase. Therefore, it is preferable that the first portion 28*a* is not in contact with the anode electrode 12. Therefore, it is preferable that the first portion 28*a* is separated from the first plane P1.

Due to the existence of the first portion 28*a* of the n-type edge region 28 between the first stripe region 22*a* and the anode region 24, there is a concern that pinch-off due to the depletion layer between the first stripe region 22*a* and the anode region 24 at the time of reverse bias of the MPS 100 is less likely to occur. From the viewpoint of facilitating the pinch-off due to the depletion layer between the first stripe region 22*a* and the anode region 24, the distance between the first stripe region 22*a* and the anode region 24 is preferably small. Therefore, the distance d2 between the first stripe region 22*a* and the anode region 24 in the second direction is preferably smaller than the distance (d7 in FIG. 3) between the third stripe region 22*c* and the first stripe region 22*a* in the second direction.

As described above, according to the embodiment, it is possible to provide a semiconductor device capable of improving the tolerance.

In the embodiment, the SiC layer has been described as an example of the semiconductor layer, but the embodiment can be applied to a diode using, for example, a silicon (Si) layer instead of the SiC layer.

In addition, in the embodiment, the case where the 4H—SiC is used as the SiC has been described as an example, but other crystal form SiC such as 3C—SiC and 6H—SiC can be used.

In addition, in the embodiment, although the case where the semiconductor layer is an SiC layer, the first plane is a plane inclined by 0° or more and 8° or less with respect to the (0001) plane, and the second plane is a plane inclined by 0° or more and 8° or less with respect to the (000-1) plane has been described as an example, a plane having another plane orientation can also be used.

In addition, in the embodiment, although nitrogen (N) has been described as an example of the n-type impurity, phosphorus (P), arsenic (As), antimony (Sb), and the like can be applied. In addition, although aluminum (Al) has been described as an example of the p-type impurity, boron (B) can also be used.

In addition, in the embodiment, although the n-type has been described as an example of the first conductivity type and the p-type has been described as an example of the second conductivity type, the first conductivity type may be p-type and the second conductivity type may be n-type.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a first electrode;

a second electrode; and a semiconductor layer provided between the first electrode and the second electrode, the semiconductor layer having a first plane in contact with the first electrode and a second plane in contact with the second electrode, the semiconductor layer including:

a first semiconductor region of a first conductivity type in contact with the first electrode;

a second semiconductor region of a second conductivity type provided between the first plane and the first semiconductor region, the second semiconductor region extending in a first direction parallel to the first plane and in contact with the first electrode;

a third semiconductor region of the second conductivity type provided between the first plane and the first semiconductor region, the third semiconductor region extending in the first direction and in contact with the first electrode;

a fourth semiconductor region of the second conductivity type provided between the first plane and the first semiconductor region, the fourth semiconductor region interposed between the second semiconductor region and the third semiconductor region and the fourth semiconductor region being electrically connected to the first electrode; and a fifth semiconductor region of the first conductivity type provided between the first semiconductor region and the fourth semiconductor region, a first conductivity type impurity concentration of the fifth semiconductor region being higher than a first conductivity type impurity concentration of the first semiconductor region, the fifth semiconductor region including a first portion that is separated from the first electrode, wherein a first width of the fourth semiconductor region in a second direction parallel to the first plane and perpendicular to the first direction is larger than a second width of the second semiconductor region in the second direction, wherein a first distance between the second semiconductor region and the first portion in the second direction is smaller than a second distance between the second semiconductor region and the fourth semiconductor region in the second direction, and wherein a third width of the first portion in the second direction is smaller than the first width.

2. The semiconductor device according to claim 1, wherein the fifth semiconductor region further includes a second portion, the first semiconductor region is interposed between the first portion and the second portion, and wherein a third distance between the third semiconductor region and the second portion in the second direction is smaller than a fourth distance between the third semiconductor region and the fourth semiconductor region in the second direction.

3. The semiconductor device according to claim 2, wherein a shape of the fifth semiconductor region viewed from a third direction perpendicular to the first plane is an annular shape.

4. The semiconductor device according to claim 2, further comprising a metal semiconductor compound layer provided between the fourth semiconductor region and the first electrode, wherein a fifth distance between the first portion and the second portion in the second direction is larger than a fourth width of the metal semiconductor compound layer in the second direction.

5. The semiconductor device according to claim 1, wherein a sixth distance between the first portion and the first plane is smaller than a depth of the fourth semiconductor region with respect to the first plane as a reference.

6. The semiconductor device according to claim 1, wherein the semiconductor layer further includes a sixth semiconductor region of the second conductivity type provided between the first plane and the first semiconductor region, the sixth semiconductor region extending in the first direction, the sixth semiconductor region being in contact with the first electrode, and the second semiconductor region being interposed between the fourth semiconductor region and the sixth semiconductor region.

7. The semiconductor device according to claim 6, wherein the second distance is smaller than a seventh distance between the sixth semiconductor region and the second semiconductor region.

8. The semiconductor device according to claim 1, wherein the semiconductor layer further includes:

a seventh semiconductor region provided between the first plane and the first semiconductor region and surrounding the second semiconductor region, the third semiconductor region, and the fourth semiconductor region; and an eighth semiconductor region provided between the first semiconductor region and the seventh semiconductor region and surrounding the second semiconductor region, the third semiconductor region, and the fourth semiconductor region, a first conductivity type impurity concentration of the eighth semiconductor region being higher than the first conductivity type impurity concentration of the first semiconductor region, and wherein the first conductivity type impurity concentration of the fifth semiconductor region is lower than the first conductivity type impurity concentration of the eighth semiconductor region.

9. The semiconductor device according to claim 1, wherein the semiconductor layer is a silicon carbide layer.

* * * * *